United States Patent
Oda (10) Patent No.: US 7,345,328 B2
(45) Date of Patent: Mar. 18, 2008

(54) SOLID-STATE IMAGE PICK-UP DEVICE OF PHOTOELECTRIC CONVERTING FILM LAMINATION TYPE

(75) Inventor: Kazuya Oda, Saitama (JP)

(73) Assignee: Fujifilm Corporation, Tokyo (JP)

( * ) Notice: Subject to any disclaimer, the term of this patent is extended or adjusted under 35 U.S.C. 154(b) by 39 days.

(21) Appl. No.: 11/358,134

(22) Filed: Feb. 22, 2006

(65) Prior Publication Data

US 2006/0197172 A1    Sep. 7, 2006

(30) Foreign Application Priority Data

Feb. 23, 2005    (JP)    ............... P. 2005-047191

(51) Int. Cl.
    *H01L 27/148*    (2006.01)
(52) U.S. Cl. .............. 257/231; 257/291; 257/444; 257/E21.617; 257/E27.159; 257/293
(58) Field of Classification Search ............. None
    See application file for complete search history.

(56) References Cited

U.S. PATENT DOCUMENTS 6,072,555 A * 6/2000 Mizutome et al. ........ 349/144

FOREIGN PATENT DOCUMENTS

| JP | 58-103165 | 6/1983 |
|---|---|---|
| JP | 2002-83946 | 3/2002 |
| JP | 3405099 | 7/2003 |

* cited by examiner

*Primary Examiner*—Sue A. Purvis
*Assistant Examiner*—Scott Wilson
(74) *Attorney, Agent, or Firm*—McGinn IP Law Group, PLLC (57) ABSTRACT

A solid-state image pick-up device of a photoelectric converting film lamination type including a semiconductor substrate and at least three layers of photoelectric converting films each of which is interposed between a common electrode film and pixel electrode films. The pixel electrode films correspond to pixels respectively, and at least three layers of photoelectric converting films are laminated through insulating layers. The at least three layers of photoelectric converting films are above the semiconductor substrate. Sets of the pixel electrode films are provided on each of the at least three layers of photoelectric converting films, and electric charge storage portions formed on the semiconductor substrate are connected through sets of columnar contact electrodes. Resistance values of the sets of columnar contact electrodes are equal to each other.

20 Claims, 6 Drawing Sheets

SOLID-STATE IMAGE PICK-UP DEVICE OF PHOTOELECTRIC CONVERTING FILM LAMINATION TYPE

BACKGROUND OF THE INVENTION

1. Field of the Invention

The present invention relates to a solid-state image pick-up device in which photoelectric converting films to be a plurality of layers are laminated on a semiconductor substrate in which a signal reading circuit is formed, and more particularly to a solid-state image pick-up device of a photoelectric converting film lamination type in which each of signal charges generated in the photoelectric converting film to be each layer is uniformly moved toward a semiconductor substrate side, thereby suppressing the generation of an afterimage.

2. Description of the Related Art

A prototypical element of the solid-state image pick-up device of a photoelectric converting film lamination type has been described in JP-A-58-103165, for example. The solid-state image pick-up device has such a structure that three photosensitive layers are laminated on a semiconductor substrate and each of electric signals for red (R), green (G) and blue (B) colors detected in the photosensitive layers is read by an MOS circuit formed on a surface of a semiconductor substrate.

While the solid-state image pick-up device having such a structure was proposed in the past, there have remarkably been progressed an image sensor of a CCD type and an image sensor of a CMOS type in which a large number of light receiving portions (photodiodes) are integrated on a surface portion of a semiconductor substrate and color filters for red (R), green (G) and blue (B) colors are laminated on each of the light receiving portions. At present, an image sensor having several millions light receiving portions (pixels) integrated on one chip is loaded onto a digital still camera.

Referring to the image sensor of the CCD type and the image sensor of the CMOS type, however, their technical progress has been developed up to an almost limit and an opening of a light receiving portion has a size of approximately 2 µm which is close to a wavelength order of an incident light. Consequently, there is a confronted problem in that a manufacturing yield is poor.

An upper limit of the amount of photoelectric charges to be stored in the light receiving portion which is microfabricated is small, that is, has approximately 3000 electrons. Consequently, it is also hard to clearly represent 256 gradations. For this reason, it is difficult to expect a more excellent image sensor of a CCD type or a CMOS type in respect of picture quality and a sensitivity.

As a solid-state image pick-up device to solve these problems, therefore, the solid-state image pick-up device proposed in JP-A-58-103165 has been reconsidered, and image sensors described in Japanese Patent No. 3405099 and JP-A-2002-83946 have been proposed newly.

The image sensor described in the Japanese Patent No. 3405099 has such a structure that ultrafine particles of silicon are dispersed into a medium to form a photoelectric converting layer, and three photoelectric converting layers in which a size of the ultrafine particle is varied are laminated on a semiconductor substrate and an electric signal corresponding to an amount of receipt of a light for each of red, green and blue colors is generated from each of the photoelectric converting layers.

Also in the image sensor described in the JP-A-2002-83946, similarly, three nanosilicon layers having different particle sizes are laminated on the semiconductor substrate and each of electric signals for red, green and blue colors detected from each of the nanosilicon layers is read into a charge storage diode formed in a surface portion of the semiconductor substrate.

Figure 6:
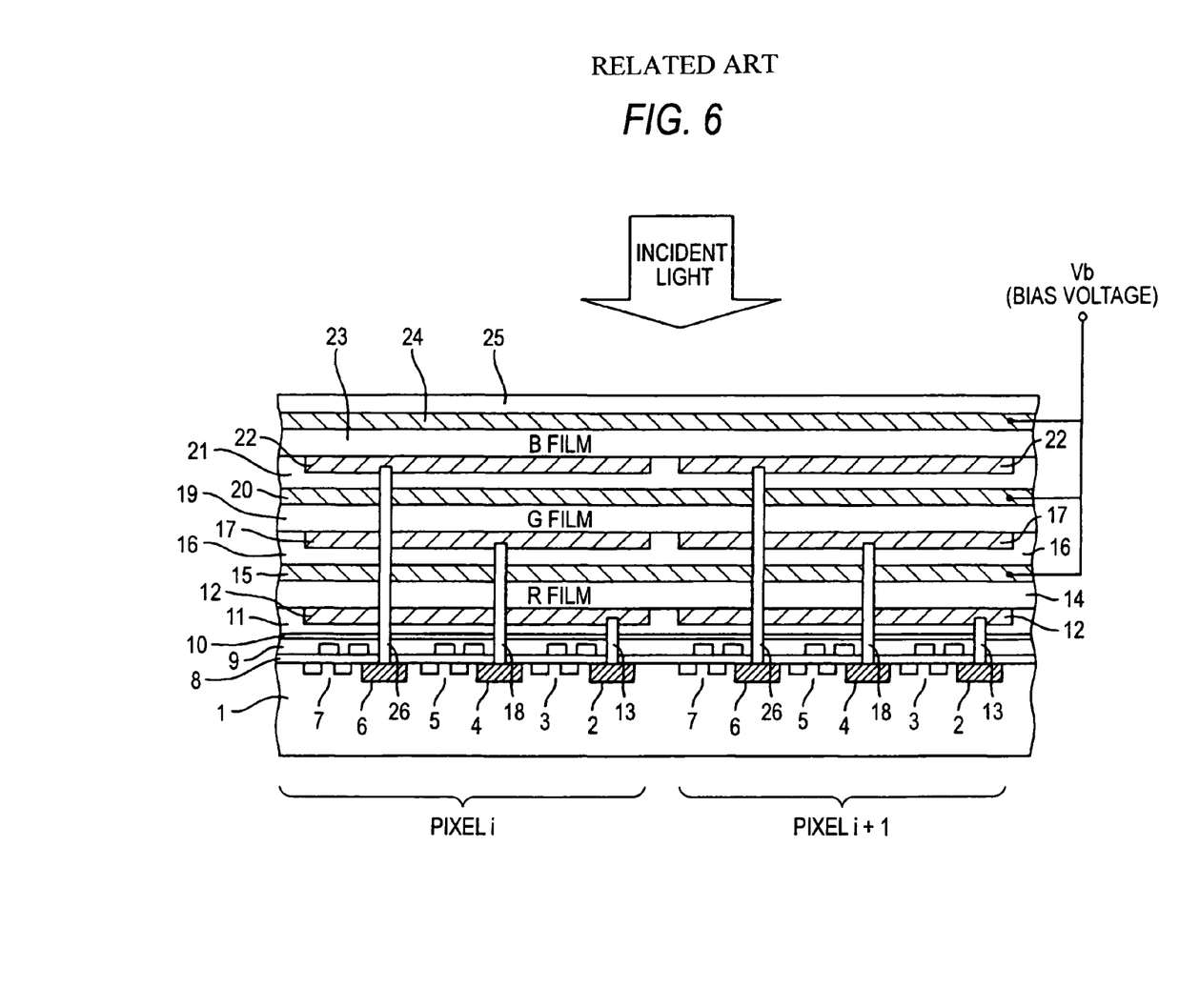
FIG. 6 is a typical sectional view corresponding to two pixels in the related-art solid-state image pick-up device of a photoelectric converting film lamination type.

FIG. 6 is a typical sectional view corresponding to two pixels in the related-art solid-state image pick-up device of a photoelectric converting film lamination type. In FIG. 6, a surface portion of a P well layer 1 formed on an n-type silicon substrate is provided with an impurity region 2 having a high concentration for storing a read signal, an MOS circuit 3 for reading the read signal, an impurity region 4 having a high concentration for storing a green signal, an MOS circuit 5 for reading the green signal, an impurity region 6 having a high concentration for storing a blue signal, and an MOS circuit 7 for reading the blue signal.

The MOS circuits 3, 5 and 7 are constituted by impurity regions for a source and a drain which are formed on the surface of the semiconductor substrate, and a gate electrode formed through a gate insulating film 8. An insulating film 9 is laminated on the gate insulating film 8 and the gate electrode and is flattened, and a shielding film 10 is laminated thereon. The shielding film is formed by a metallic thin film in many cases. For this reason, an insulating film 11 is further formed thereon.

Signal charges stored in the impurity regions 2, 4 and 6 having a high concentration for storing color signals are read to an outside by means of the MOS circuits 3, 5 and 7.

A pixel electrode film 12 divided for each pixel is formed on the insulating film 11 shown in FIG. 6. The pixel electrode film 12 for each pixel is conducted to the impurity region 2 having a high concentration for storing a red signal every pixel through a columnar contact electrode 13. The contact electrode 13 is electrically insulated from portions other than the pixel electrode film 12 and the impurity region 2 having a high concentration.

A photoelectric converting film 14 for detecting a red color is laminated on each pixel electrode film 12 in a one-sheet structure in common to each pixel, and furthermore, a transparent common electrode film 15 is formed thereon in a one-sheet structure in common to each pixel.

Similarly, a transparent insulating film 16 is formed on the common electrode film 15 and a transparent pixel electrode film 17 divided for each pixel is formed thereon. Each pixel electrode film 17 and the corresponding impurity region 4 having a high concentration for storing a green signal for each pixel are conducted through a columnar contact electrode 18. The contact electrode 18 is electrically insulated from portions other than the pixel electrode film 17 and the impurity region 4 having a high concentration. A photoelectric converting film 19 for detecting a green color is formed on each pixel electrode film 17 in a one-sheet structure in the same manner as the photoelectric converting film 14, and a transparent common electrode film 20 is formed thereon.

A transparent insulating film 21 is formed on the common electrode film 20 and a pixel electrode film 22 divided for each pixel is formed thereon. The pixel electrode film 22 is conducted to the corresponding impurity region 6 having a high concentration for storing a blue signal for each pixel through a columnar contact electrode 26. The contact electrode 26 is electrically insulated from portions other than the pixel electrode film 22 and the impurity region 6 having a high concentration. A photoelectric converting film 23 for detecting a blue color is laminated on the pixel electrode film 22 in a one-sheet structure in common to each pixel and a transparent common electrode film 24 is formed thereon, and a transparent protective film 25 is formed as an uppermost layer.

When a light is incident on the solid-state image pick-up device, photoelectric charges corresponding to the amount of an incident light for each of the blue, green and red colors are excited in each of the photoelectric converting films 23, 19 and 14, and a voltage is applied between the common electrode films 24, 20 and 15 and the pixel electrode films 22, 17 and 12. Consequently, the respective photoelectric charges flow into the impurity regions having a high concentration 2, 4 and 6 and are read as blue, green and red signals to the outside through the MOS circuits 3, 5 and 7.

In the related-art solid-state image pick-up device of the photoelectric converting film lamination type shown in FIG. 6, the signal charges generated in the photoelectric converting films 14, 19 and 23 flow to the signal charge storage portions (the impurity regions having a high concentration) 2, 4 and 6 through contact electrodes 13, 18 and 26 respectively, and are read through the MOS circuits 3, 5 and 7. A length of the contact electrode 13 connected to the pixel electrode film 12 provided on the photoelectric converting film 14 to be a lower layer is smaller than that of the contact electrode 18 connected to the pixel electrode film 17 of the photoelectric converting film 19 to be an intermediate layer, and a length of the contact electrode 26 connected to the pixel electrode film 22 of the photoelectric converting film 23 to be a higher layer is greater than that of the contact electrode 18. For this reason, resistance values of the contact electrodes 13, 18 and 26 are in order of the contact electrode 13<the contact electrode 18<the contact electrode 26.

When the resistance values of the contact electrodes 13, 18 and 26 are different from each other, a time required for moving the signal charges generated in the photoelectric converting films 14, 19 and 23 to the electric charge storage portions 2, 4 and 6 become nonuniform. When the signal charge generated in the photoelectric converting film 14 to be a lower layer is read, the signal charges generated in the photoelectric converting films 19 and 23 to be the intermediate and higher layers remain in the photoelectric converting films and the contact electrodes and are read together when the signal charges are to be subsequently read. In other words, there is a problem in that an afterimage phenomenon is generated.

SUMMARY OF THE INVENTION

It is an object of the invention to provide a solid-state image pick-up device of a photoelectric converting film lamination type which can suppress the generation of an afterimage phenomenon and can pick up a color image of high quality.

The invention provides a solid-state image pick-up device of a photoelectric converting film lamination type comprising: a semiconductor substrate; and at least three layers of photoelectric converting films each of which is interposed between a common electrode film and pixel electrode films, the pixel electrode films corresponding to pixels respectively, wherein said at least three layers of photoelectric converting films are laminated through insulating layers, said at least three layers of photoelectric converting films being above the semiconductor substrate, wherein sets of the pixel electrode films, each set of which are provided on each of said at least three layers of photoelectric converting films, and electric charge storage portions formed on the semiconductor substrate are connected through sets of columnar contact electrodes, and wherein resistance values of the sets of columnar contact electrodes are equal to each other.

The invention provides the solid-state image pick-up device of a photoelectric converting film lamination type, wherein a set of contact electrodes having a greater height, among the sets of contact electrodes having different heights, have a cross-sectional area increased and have a resistance value reduced so as to have an equal resistance value to that of a set of contact electrodes having a smaller height.

The invention provides the solid-state image pick-up device of a photoelectric converting film lamination type, wherein the sets of contact electrodes having different heights are manufactured to have an equal cross-sectional area and are formed by different materials to have an equal resistance value.

The invention provides the solid-state image pick-up device of a photoelectric converting film lamination type, wherein the photoelectric converting films comprises a first photoelectric converting film for absorbing a red light, a second photoelectric converting film for absorbing a green light and a third photoelectric converting film for absorbing a blue light, each of the first, second and third photoelectric converting films being separated into films corresponding to the pixels respectively, and order of lamination of the first photoelectric converting film, the second photoelectric converting film and the third photoelectric converting film is cyclically changed in adjacent pixels.

DETAILED DESCRIPTION OF THE INVENTION

An embodiment of the invention will be described below with reference to the drawings.

First Embodiment

Figure 1A:
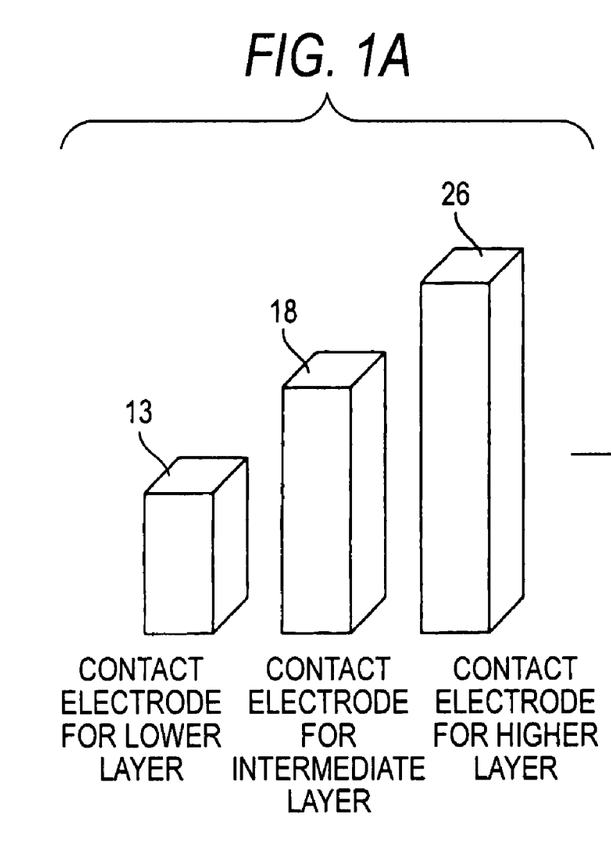
FIG. 1 is an explanatory view showing a solid-state image pick-up device of a photoelectric converting film lamination type according to a first embodiment of the invention.
Figure 1B:
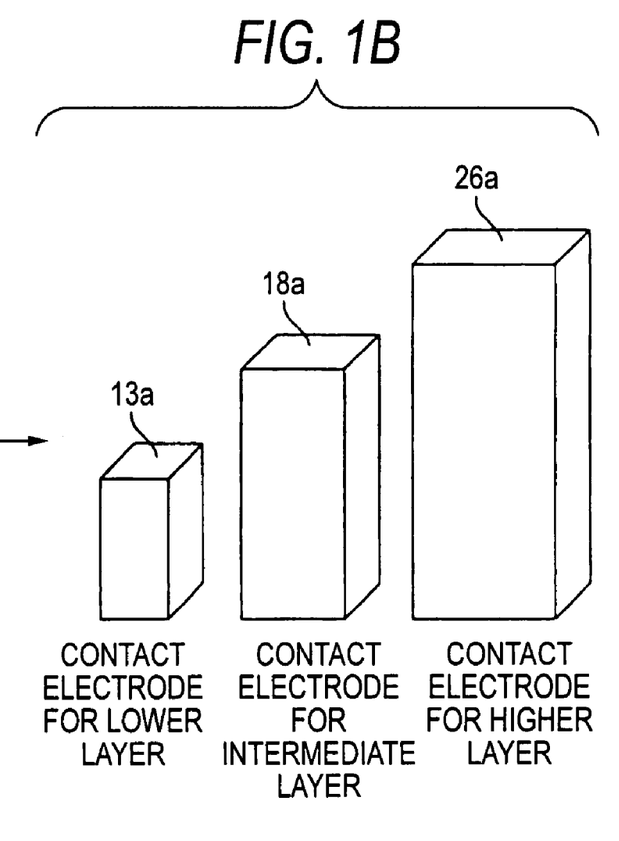

FIG. 1 is an explanatory view showing a relationship among a contact electrode for a lower layer, a contact layer for an intermediate layer and a contact electrode for a higher layer in a solid-state image pick-up device of a photoelectric converting film lamination type according to a first embodiment of the invention. As shown in FIG. 1(a), in related art, a contact electrode 13 for a lower layer, a contact electrode 18 for an intermediate layer, and a contact layer 26 for a higher layer are manufactured to have an equal thickness and an equal cross-sectional area. In the embodiment, as shown in FIG. 1(b), a contact electrode 18a for an intermediate layer is manufactured to be thicker than a contact electrode 13a for a lower layer and a contact electrode 26a for a higher layer is manufactured to be much thicker, and resistance values between both ends of each of the contact electrodes 13a, 18a and 26a are set to be equal to each other.

Figure 2:
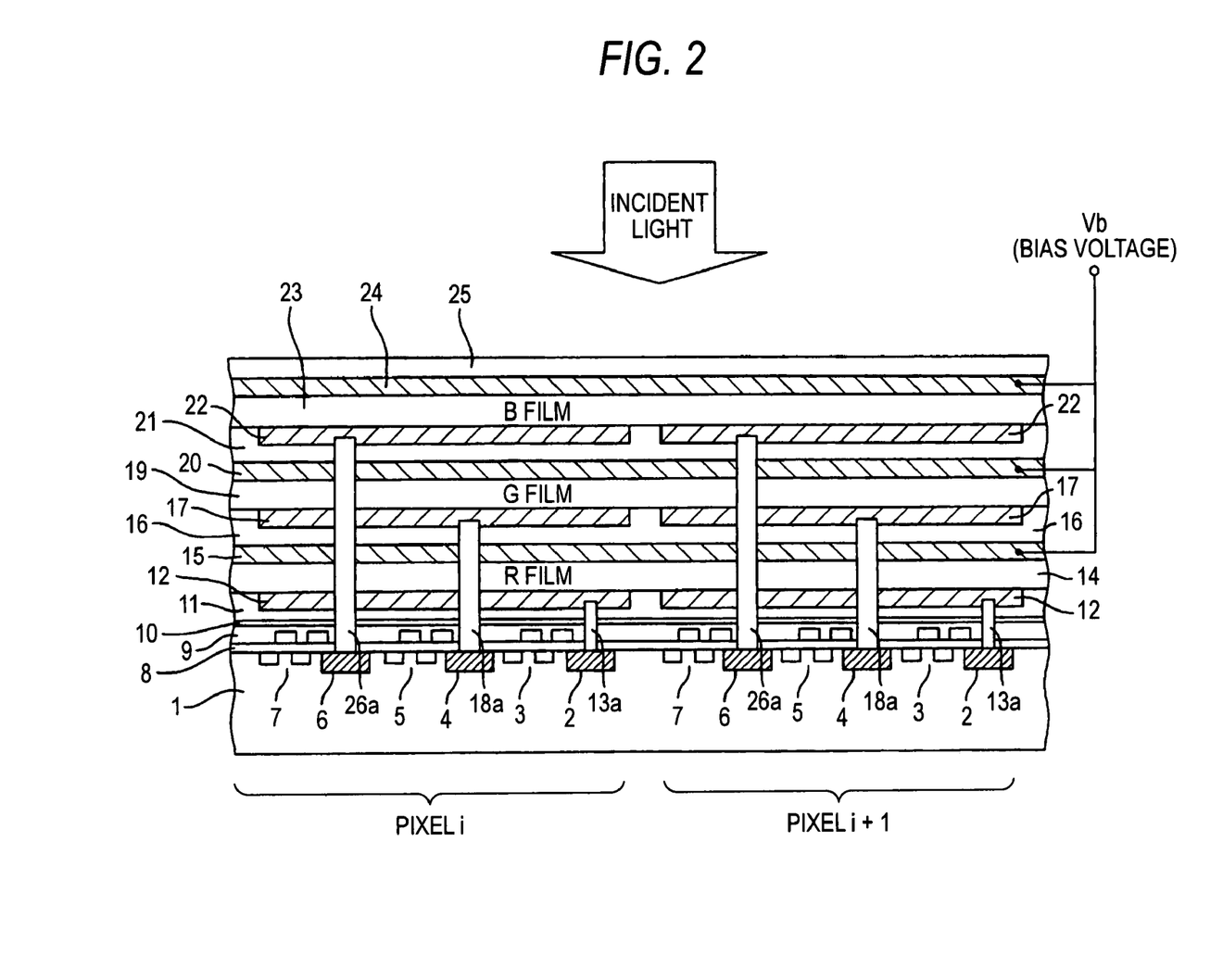
FIG. 2 is atypical sectional view corresponding to two pixels in the solid-state image pick-up device of a photoelectric converting film lamination type according to the first embodiment of the invention.

FIG. 2 is a typical sectional view corresponding to two pixels in which the contact electrodes 13a, 18a and 26a illustrated in FIG. 1(b) are applied to the solid-state image pick-up device of a photoelectric converting film lamination type shown in FIG. 6. Description of FIG. 6 is repetitive. Referring to a detailed structure of the solid-state image pick-up device of a photoelectric converting film lamination type shown in FIG. 2, therefore, the same members as those in the solid-state image pick-up device of a photoelectric converting film lamination type in FIG. 6 have the same reference numerals and description thereof will be omitted.

As described with reference to FIG. 1, the embodiment is characterized in that the cross-sectional areas of the contact electrodes 13a, 18a and 26a are increased toward the contact electrodes for the higher layers and the resistance values of the contact electrodes 13a, 18a and 26a are set to be equal to each other.

In the solid-state image pick-up device of a photoelectric converting film lamination type according to the embodiment, consequently, it is possible to read a signal charge for a red color, a signal charge for a green color and a signal charge for a blue color in an equal time. Consequently, it is possible to obtain a color image of high quality which has no afterimage.

Second Embodiment

While the cross-sectional areas of the contact electrodes 13a, 18a and 26a are changed in order to cause the resistances thereof to be equal to each other in the first embodiment, the embodiment is characterized in that the contact electrodes 13a, 18a and 26a are set to have an equal thickness and materials of the contact electrodes 13a, 18a and 26a are changed. More specifically, a material having a high conductivity is used for the contact electrode 26a, a material having a low conductivity is used for the contact electrode 13a, and a material having an intermediate conductivity is used for the contact electrode 18a. Also in the embodiment, consequently, it is possible to obtain the same advantages as those of the first embodiment.

Third Embodiment

Figure 3:
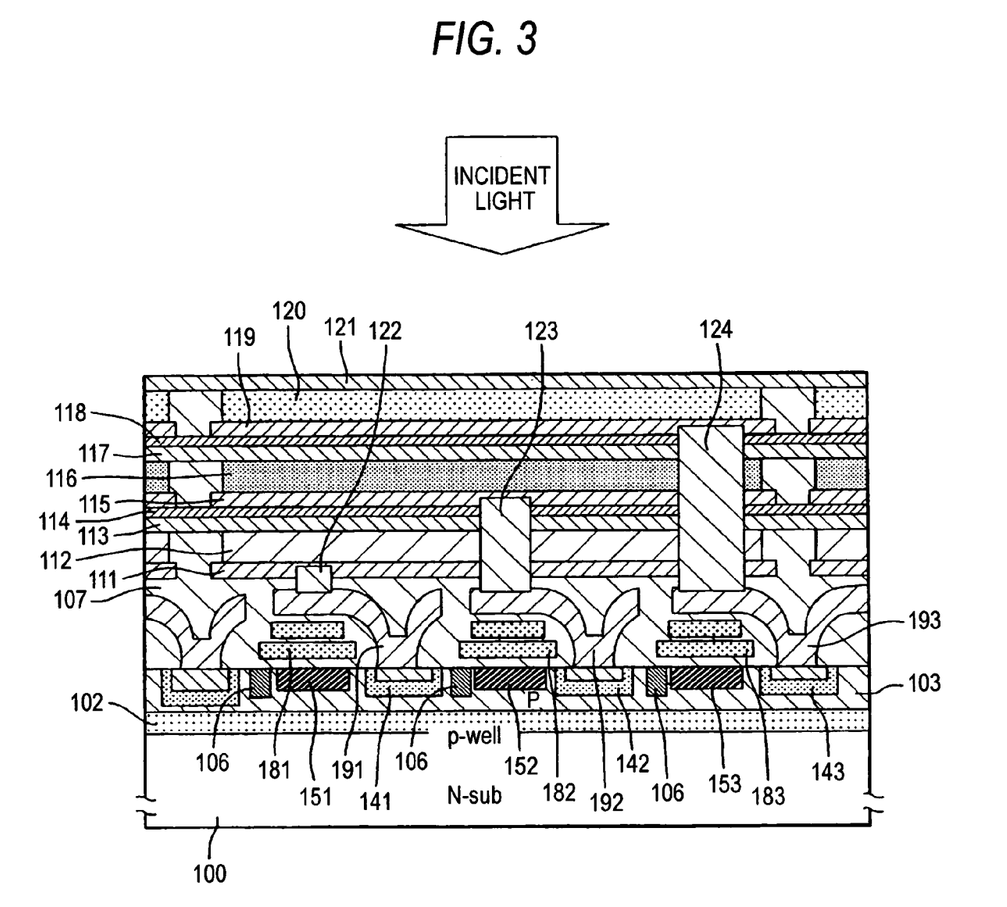
FIG. 3 is a typical sectional view corresponding to one pixel in a solid-state image pick-up device of a photoelectric converting film lamination type according to a third embodiment of the invention.

FIG. 3 is a typical sectional view corresponding to one pixel in a solid-state image pick-up device of a photoelectric converting film lamination type according to a third embodiment of the invention. A signal reading circuit is formed in a surface portion of a semiconductor substrate 100. Although the signal reading circuit may be constituted by an MOS transistor circuit in the same manner as in FIG. 2, it is constituted by an electric charge transfer path in the same manner as in the related-art image sensor of a CCD type in the embodiment.

In the solid-state image pick-up device of a photoelectric converting film lamination type shown in FIG. 3, a P well layer 102 is formed in a surface portion of an n-type semiconductor substrate 100, and furthermore, a diode portion 141 to be a first color charge storage region, a diode portion 142 to be a second color charge storage region and a diode portion 143 to be a third color charge storage region are formed and electric charge transfer paths 151, 152 and 153 are formed between the diodes in a P region 103 on the surface portion. A channel stopper 106 to be a p$^+$ region is formed between the diode portion 141 and the electric charge transfer path 151, the diode portion 142 and the electric charge transfer path 152, and the diode portion 143 and the electric charge transfer path 153 which make pairs.

An insulating layer 107 is laminated on the surface of the semiconductor substrate 100 and electric charge transfer electrodes 181, 182 and 183 are formed on the electric charge transfer paths 151, 152 and 153 in the insulating layer 107, and furthermore, electrodes 191, 192 and 193 connected to the diode portions 141, 142 and 143 are buried. The electrodes 191, 192 and 193 according to the embodiment also serve as shielding films in such a manner that an incident light (mainly, an infrared ray because a visible light portion in the incident light is absorbed by a photoelectric converting film to be an upper layer) is not incident on the signal reading circuit provided on the surface of the semiconductor substrate (the electric charge transfer electrodes 181, 182 and 183).

A pixel electrode film 111 for a first color which is divided every pixel is laminated on the insulating layer 107. The pixel electrode film 111 is formed by a transparent material.

A photoelectric converting film 112 to be a first layer which photoelectrically converts an incident light for the first color is laminated on each pixel electrode film 111 with a division for each pixel, and a transparent common electrode film (a counter electrode film to the pixel electrode film 111) 113 is laminated on the photoelectric converting film 112 to be the first layer.

A transparent insulating film 114 is laminated on the common electrode film 113, and furthermore, a transparent pixel electrode film 115 for a second color which is divided every pixel is laminated thereon. Then, a photoelectric converting film 116 to be a second layer which photoelectrically converts an incident light for the second color is laminated on each pixel electrode film 115 with a division every pixel, and a transparent common electrode film (a counter electrode to the pixel electrode film 115) 117 is laminated on the photoelectric converting film 116 to be the second layer.

A transparent insulating film 118 is laminated on the common electrode film 117, and furthermore, a transparent pixel electrode film 119 for a third color which is divided every pixel is laminated thereon. Then, a photoelectric converting film 120 to be a third layer which photoelectrically converts an incident light for the third color is laminated on each pixel electrode film 119 with a division for each pixel, and a transparent common electrode film (a counter electrode to the pixel electrode film 119) 121 is laminated on the photoelectric converting film 120 to be the third layer. In some cases, moreover, a protective film is formed thereon, which is not shown.

The pixel electrode film 111 for a first color is electrically connected to the electrode 191 of the diode portion 141 for a first color charge storage through a columnar contact electrode 122, the pixel electrode film 115 for a second color is electrically connected to the electrode 192 of the diode portion 142 for a second color charge storage through a columnar contact electrode 123, and the pixel electrode film 119 for a third color is electrically connected to the electrode 193 of the diode portion 143 for a third color charge storage through a columnar contact electrode 124. The contact electrodes 122, 123 and 124 are insulated from portions other than the electrodes 191, 192 and 193 and the pixel electrode films 111, 115, and 119 which correspond thereto.

In the embodiment, the contact electrode 123 for an intermediate layer is manufactured to be thicker than the contact electrode 122 for a lower layer, and the contact electrode 124 for a higher layer is manufactured to be much thicker, and resistance values of the contact electrodes 122, 123 and 124 are set to be equal to each other. In the same manner as in the second embodiment, it is apparent that the contact electrodes 122, 123 and 124 are manufactured to have an equal thickness and to have an equal resistance value with a change in each material.

Materials for the photoelectric converting films 112, 116 and 120 to be the respective layers may be organic or inorganic, and it is preferable to use a thin film structure of a direct transition type, a fine particle structure and a Gratzel structure. In case of the fine particle structure, it is possible to control a band gap end. By controlling a nano-particle size such as CdSe, InP, ZnTe or ZnSe, for example, it is possible to control a wavelength region to be converted photoelectrically.

The first color is set to be a red color (R), the second color is set to be a green color (G), and the third color is set to be a blue color (B). When a light is incident on the solid-state image pick-up device of a photoelectric converting film lamination type, a light in a wavelength region having the blue color in the incident light is absorbed into the photoelectric converting film 120 to be the third layer so that an electric charge corresponding to an amount of the light thus absorbed is generated and flows from the pixel electrode film 119 into the diode portion 143 through the contact electrode 124 and the electrode 193.

Similarly, a light in a wavelength region having the green color in the incident light is transmitted through the photoelectric converting film 120 to be the third layer and is absorbed into the photoelectric converting film 116 to be the second layer so that an electric charge corresponding to an amount of the light thus absorbed is generated and flows from the pixel electrode film 115 into the diode portion 142 through the contact electrode 123 and the electrode 192.

Similarly, a light in a wavelength region having the red color in the incident light is transmitted through the photoelectric converting films 120 and 116 to be the third and second layers and is absorbed into the photoelectric converting film 112 to be the first layer so that an electric charge corresponding to an amount of the light thus absorbed is generated and flows from the pixel electrode film 111 into the diode portion 141 through the contact electrode 122 and the electrode 191.

A signal can be fetched from each of the diode portions 141, 142 and 143 by an ordinary technique in accordance with the fetch of a signal from a light receiving unit of silicon. For example, a constant amount of bias charges are injected into the diode portions 141, 142 and 143 (a refresh mode) and a constant charges are stored by the incidence of a light (a photoelectric converting mode), and a signal charge is then read out. An organic light receiving unit itself may be used as a charge storage diode and a charge storage diode may be separately provided additionally.

As described above, in the solid-state image pick-up device of a photoelectric converting film lamination type according to the embodiment, it is possible to read the signal charges for the respective colors in an equal time in the same manner as in the first and second embodiments. Therefore, it is possible to obtain a color image of high picture quality which has no after image. In the solid-state image pick-up device of a photoelectric converting film lamination type according to the embodiment, moreover, the photoelectric converting films to be the first, second and third layers are formed with a division every pixel. Consequently, it is also possible to obtain an advantage that a pixel separation performance of a photoelectric charge flowing into the diodes 141, 142 and 143, that is, a pixel signal can be enhanced.

Fourth Embodiment

Figure 4:
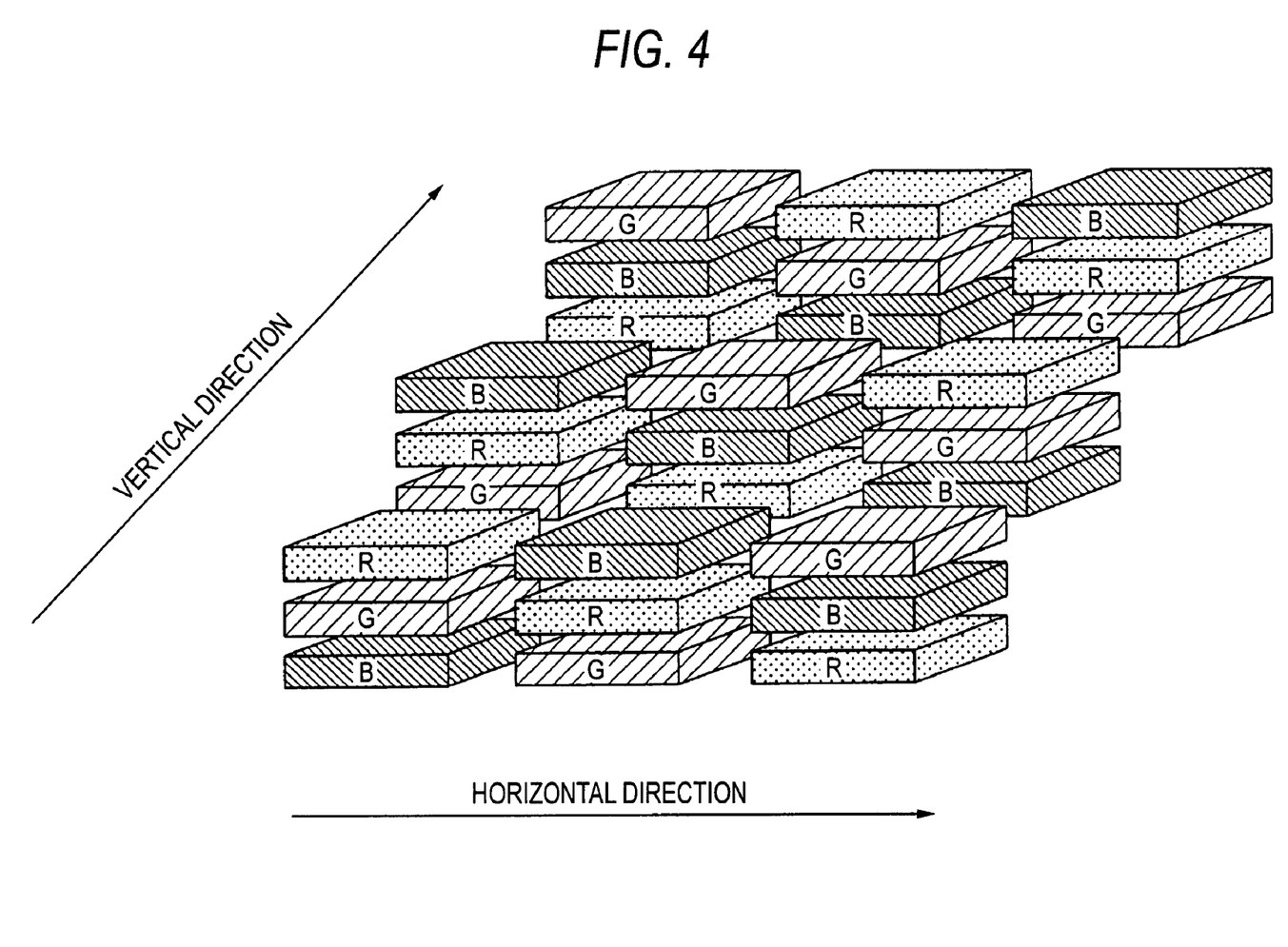
FIG. 4 is a view showing an example of an arrangement of color order of a photoelectric converting film in a solid-state image pick-up device of a photoelectric converting film lamination type according to a fourth embodiment of the invention.

FIG. 4 is an explanatory view showing a solid-state image pick-up device of a photoelectric converting film lamination type according to a fourth embodiment of the invention. A structure of the solid-state image pick-up device of a photoelectric converting film lamination type according to the embodiment is basically the same as that of the solid-state image pick-up device of a photoelectric converting film lamination type according to the embodiment shown in FIG. 3, and furthermore, manufacture is carried out by cyclically changing, in adjacent pixels, order for superposing a photoelectric converting film for detecting a red color (R), a photoelectric converting film for detecting a green color (G) and a photoelectric converting film for detecting a blue color (B) in the embodiment. FIG. 4 is a view showing an example of an arrangement of only a photoelectric converting film for each color, illustrating a portion in which the order of colors for superposing the photoelectric converting films are changed in a matrix.

Figure 5:
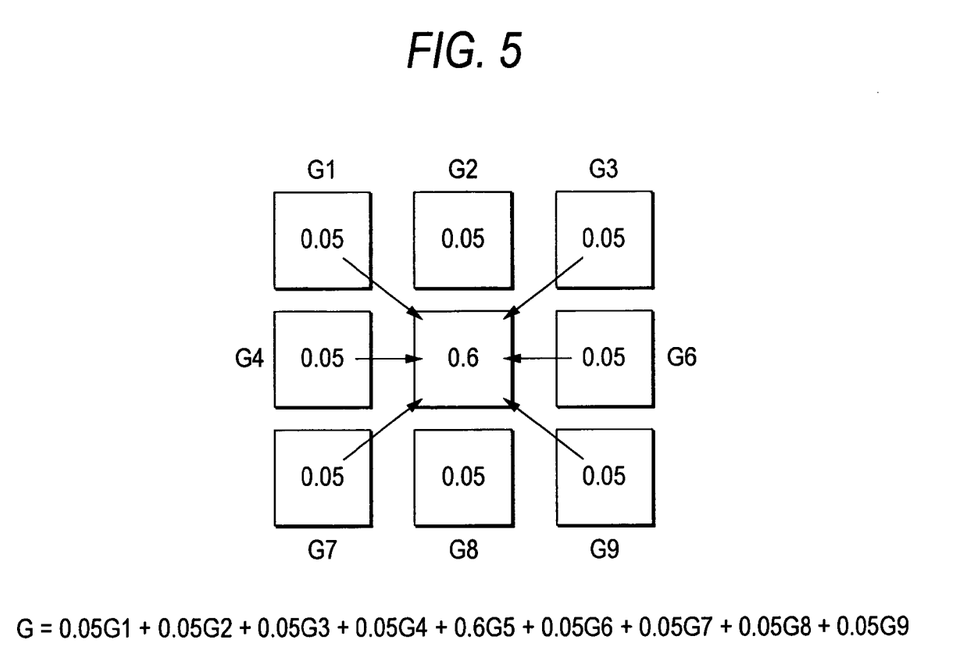
FIG. 5 is a view showing an example of a correction for a color signal in the solid-state image pick-up device of a photoelectric converting film lamination type illustrated in FIG. 4.

FIG. 5 is an explanatory view showing a signal correction processing of obtaining a signal charge for a certain pixel and a certain color. In this example, a correction is carried out in order to add, at a certain ratio, a signal for the same color in eight peripheral pixels surrounding a corresponding pixel (a central one of 3×3 pixels).

For example, in the case in which G1, G2 and G3 are set from an upper left part of nine pixels of 3×3 in a rightward direction, G4, G5 and G6 are set from a left side in a next row and G7, G8 and G9 are set from the left side in a subsequent row, a signal for a green color (G) of a corresponding pixel is obtained by a calculation:

$$G=0.05G1+0.05G2+0.05G3+0.05G4+0.6G5+0.05G6+0.05G7+0.05G8+0.05G9.$$

A red signal and a blue signal are also obtained in the same equation.

Also in the embodiment, a contact electrode for a lower layer, a contact electrode for an intermediate layer and a contact electrode for a higher layer are manufactured to have equal resistance values. Even if they are manufactured with high precision, however, it is impossible to eliminate a manufacturing error. For this reason, a slight reading failure might be caused.

As in the embodiment, therefore, when the order of colors of the photoelectric converting films in the respective pixels is changed cyclically as shown in FIG. 4 to obtain a color signal in accordance with the above equation, the influence of a reading failure with a delay of a moving speed of an electric charge generated every pixel is relieved. Consequently, it is possible to obtain a color image of high picture quality.

According to the invention, the contact electrodes having different heights are set to have equal resistance values. Therefore, it is possible to read a signal from the photoelectric converting film to be each layer in an equal time and to obtain a color image of high picture quality having no afterimage. By cyclically changing the order of lamination of the photoelectric converting films for the respective colors through adjacent pixels, moreover, it is possible to offset and relieve an electric charge moving delay due to a manufacturing error of a contact electrode.

Since a solid-state image pick-up device of a photoelectric converting film lamination type according to the invention can prevent an afterimage from being caused by a contact electrode, it is useful for a solid-state image pick-up device capable of picking up a color image of high picture quality in place of the related-art image sensors of a CCD type and a CMOS type.

The entire disclosure of each and every foreign patent application from which the benefit of foreign priority has been claimed in the present application is incorporated herein by reference, as if fully set forth.

What is claimed is:

1. A solid-state image pick-up device of a photoelectric converting film lamination type, comprising:
   a semiconductor substrate; and
   at least three layers of photoelectric converting films interposed between a common electrode film and pixel electrode films, the pixel electrode films corresponding to pixels respectively,
   wherein said at least three layers of photoelectric converting films are laminated through insulating layers, said at least three layers of photoelectric converting films being disposed above the semiconductor substrate,
   wherein sets of the pixel electrode films are provided on said at least three layers of photoelectric converting films, and electric charge storage portions formed on the semiconductor substrate are connected through sets of columnar contact electrodes, and
   wherein resistance values of the sets of columnar contact electrodes are equal to each other.

2. The solid-state image pick-up device of a photoelectric converting film lamination type according to claim 1, wherein a set of contact electrodes having a greater height, among the sets of contact electrodes having different heights, have a cross-sectional area increased and have a resistance value reduced so as to have an equal resistance value to that of a set of contact electrodes having a smaller height.

3. The solid-state image pick-up device of a photoelectric converting film lamination type according to claim 1, wherein the sets of contact electrodes having different heights are manufactured to have an equal cross-sectional area and are formed by different materials to have an equal resistance value.

4. The solid-state image pick-up device of a photoelectric converting film lamination type according to claim 1, wherein the photoelectric converting films comprises a first photoelectric converting film for absorbing a red light, a second photoelectric converting film for absorbing a green light and a third photoelectric converting film for absorbing a blue light, each of the first, second and third photoelectric converting films being separated into films corresponding to the pixels respectively, and
   wherein an order of lamination of the first photoelectric converting film, the second photoelectric converting film and the third photoelectric converting film is cyclically changed in adjacent pixels.

5. The solid-state image pick-up device of a photoelectric converting film lamination type according to claim 1, wherein each of said at least three layers of photoelectric converting films is interposed between a common electrode film and pixel electrode films.

6. The solid-state image pick-up device of a photoelectric converting film lamination type according to claim 1, wherein the sets of pixel electrode films are provided on each of said at least three layers of photoelectric converting films.

7. The solid-state image pick-up device of a photoelectric converting film lamination type according to claim 1, wherein the sets of contact electrodes having different heights are manufactured to have an equal cross-sectional area.

8. The solid-state image pick-up device of a photoelectric converting film lamination type according to claim 1, wherein the sets of contact electrodes having different heights are formed by different materials.

9. The solid-state image pick-up device of a photoelectric converting film lamination type according to claim 1, wherein the photoelectric converting films comprise:
   a first photoelectric converting film;
   a second photoelectric converting film; and
   a third photoelectric converting film,
   wherein said first photoelectric converting film, said second photoelectric converting film, and said third photoelectric converting film each absorb a different color of light.

10. The solid-state image pick-up device of a photoelectric converting film lamination type according to claim 9, wherein said first photoelectric converting film, said second photoelectric converting film, and said third photoelectric converting film are separated into films corresponding to the pixels respectively.

11. The solid-state image pick-up device of a photoelectric converting film lamination type according to claim 9, wherein an order of lamination of the first photoelectric converting film, the second photoelectric converting film, and the third photoelectric converting film is cyclically changed in adjacent pixels.

12. The solid-state image pick-up device of a photoelectric converting film lamination type according to claim 1, wherein a set of columnar contact electrodes comprises three columnar contact electrodes.

13. The solid-state image pick-up device of a photoelectric converting film lamination type according to claim 1, wherein the at least three layers of photoelectric converting films comprise a first layer, a second layer disposed over the first layer, and a third layer disposed over the second layer.

14. The solid-state image pick-up device of a photoelectric converting film lamination type according to claim 13, wherein the first layer, the second layer, and the third layer are connected to the electric charge storage portions by a columnar contact electrode.

15. The solid-state image pick-up device of a photoelectric converting film lamination type according to claim 13, wherein each of the first layer, the second layer, and the third layer are connected to the electric charge storage portions by a columnar contact electrode.

16. The solid-state image pick-up device of a photoelectric converting film lamination type according to claim 13, wherein a cross sectional area of a columnar contact electrode connecting the second layer to an electric charge storage portion is larger than a cross sectional area of a columnar contact electrode connecting the first layer to an electric charge storage portion.

17. The solid-state image pick-up device of a photoelectric converting film lamination type according to claim 13, wherein a cross sectional area of a columnar contact electrode connecting the third layer to an electric charge storage portion is larger than a cross sectional area of a columnar contact electrode connecting the second layer to an electric charge storage portion.

18. The solid-state image pick-up device of a photoelectric converting film lamination type according to claim 1, wherein an individual columnar contact electrode in the set of columnar contact electrodes has a different cross sectional area than another individual columnar contact electrode in the set of columnar contact electrodes.

19. A solid-state image pick-up device of a photoelectric converting film lamination type, comprising:
- a semiconductor substrate;
- a plurality of photoelectric converting films disposed above the semiconductor substrate; and
- electric charge storage portions formed on the semiconductor substrate that are connected through columnar contact electrodes to the plurality of photoelectric converting films, wherein resistance values of the columnar contact electrodes are equal to each other.

20. A solid-state image pick-up device of a photoelectric converting film lamination type, comprising:
- a semiconductor substrate;
- a plurality of photoelectric converting films disposed above the semiconductor substrate;
- a plurality of pixel electrode films provided on the plurality of photoelectric converting films; and
- electric charge storage portions formed on the semiconductor substrate that are connected to the plurality of pixel electrode films through columnar contact electrodes, wherein resistance values of the columnar contact electrodes are equal to each other.

* * * * *